(12) United States Patent
Simonnet et al.

(10) Patent No.: US 8,269,252 B2
(45) Date of Patent: Sep. 18, 2012

(54) STRUCTURE OF HIGH-FREQUENCY COMPONENTS WITH LOW STRAY CAPACITANCES

(75) Inventors: Jean-Michel Simonnet, Veretz (FR); André Lhorte, Saint Avertin (FR); Patrick Poveda, Villedomer (FR)

(73) Assignee: STMicroelectronics S.A., Montrouge (FR)

( * ) Notice: Subject to any disclaimer, the term of this patent is extended or adjusted under 35 U.S.C. 154(b) by 451 days.

(21) Appl. No.: 12/059,600

(22) Filed: Mar. 31, 2008

(65) Prior Publication Data
US 2008/0237785 A1 Oct. 2, 2008

(30) Foreign Application Priority Data
Apr. 2, 2007 (FR) ..................................... 07 54221

(51) Int. Cl.
*H01L 29/72* (2006.01)
(52) U.S. Cl. ................. 257/173; 257/E29.326
(58) Field of Classification Search .......... 257/173–174, 257/109–112, 168–171, E29.326–E29.329, 257/E29.331–E29.335, E29.337–E29.339, 257/E29.341–E29.345
See application file for complete search history.

(56) References Cited

U.S. PATENT DOCUMENTS

| | | | | |
|---|---|---|---|---|
| 4,700,211 A | * | 10/1987 | Popovic et al. | 257/423 |
| 4,888,304 A | * | 12/1989 | Nakagawa et al. | 438/406 |
| 5,241,210 A | * | 8/1993 | Nakagawa et al. | 257/487 |
| 5,344,785 A | | 9/1994 | Jerome et al. | |
| 5,841,169 A | | 11/1998 | Beasom | |
| 6,013,941 A | * | 1/2000 | Shimizu | 257/565 |
| 6,429,502 B1 | | 8/2002 | Librizzi et al. | |
| 6,562,666 B1 | * | 5/2003 | Park et al. | 438/149 |
| 6,677,657 B2 | * | 1/2004 | Gardes | 257/488 |
| 2001/0028096 A1 | | 10/2001 | Ohguro et al. | |
| 2002/0033504 A1 | * | 3/2002 | Ohnakado | 257/350 |

OTHER PUBLICATIONS

Viviani et al (Extended Study of Crosstalk in SOI-SIMOX susbtrates, 1995 IEEE, 29.3.1-29.3.4).*
French Search Report from corresponding French Application No. 07/54221, filed Apr. 2, 2007.

* cited by examiner

*Primary Examiner* — Kiesha Bryant
*Assistant Examiner* — Ali Naraghi
(74) *Attorney, Agent, or Firm* — Wolf, Greenfield & Sacks, P.C.

(57) ABSTRACT

A structure including at least two neighboring components, capable of operating at high frequencies, formed in a thin silicon substrate extending on a silicon support and separated therefrom by an insulating layer, the components being laterally separated by insulating regions. The silicon support has, at least in the vicinity of its portion in contact with the insulating layer, a resistivity greater than or equal to 1,000 ohms.cm.

20 Claims, 2 Drawing Sheets

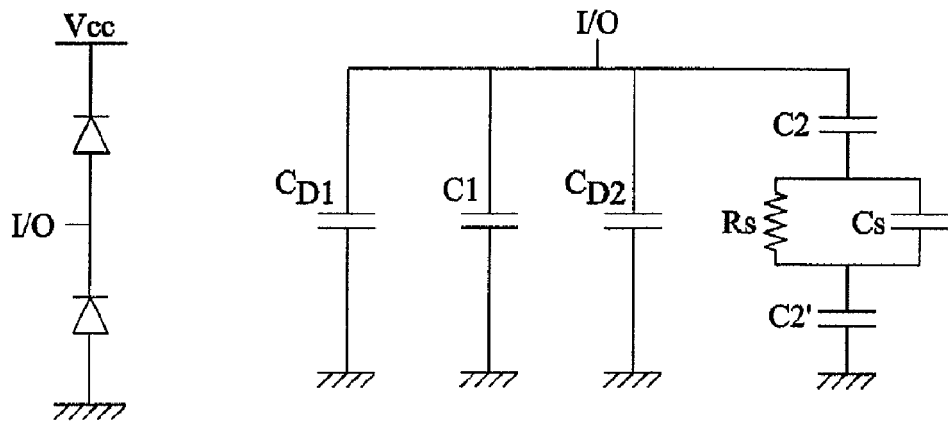
Fig 4
Fig 6
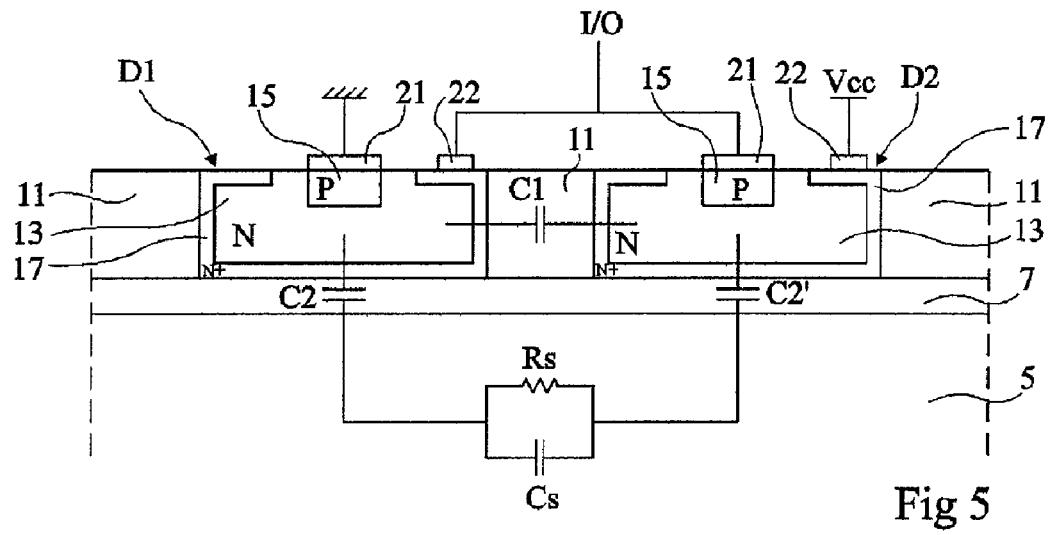
Fig 5
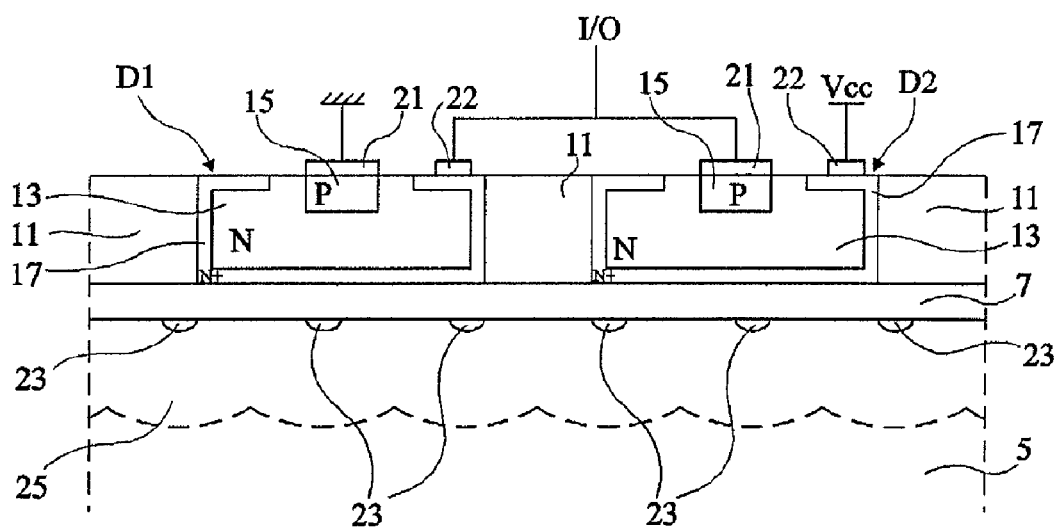
Fig 7

STRUCTURE OF HIGH-FREQUENCY COMPONENTS WITH LOW STRAY CAPACITANCES

BACKGROUND OF THE INVENTION

1. Field of the Invention

The present invention relates to a structure comprising high-frequency components, for example a protection structure.

2. Discussion of the Related Art

Generally, electronic components are formed either in a solid substrate semiconductor wafer, or in a semiconductor-on-insulator (SOI) layer.

FIG. 1 shows the upper portion of a doped solid substrate 1 of a first conductivity type, for example, P, in which are formed several doped wells 3 of a second conductivity type, for example N. High-frequency electronic components can then be formed in wells 3. The isolation between wells 3 results from an appropriate biasing of the PN junctions between wells 3 and substrate 1. The capacitances between a well 3 and substrate 1 and between two neighboring wells 3 are often non-negligible as compared with the specific capacitances of the components formed in wells 3 and this is a problem, especially in the field of high-frequency components.

FIG. 2 shows an example of an SOI type structure. This structure comprises, on a semiconductor support 5, a thin layer of a semiconductor substrate with an interposed silicon oxide layer 7. Semiconductor wells 9, in which are formed electronic components, are formed side by side in the substrate. The free space between the wells is occupied by an insulator, for example, silicon oxide 11. The silicon oxide of layer 7, as for itself, enables insulating the electronic components in the vertical direction. This structure has the advantage over the structure of FIG. 1 of decreasing the values of the stray capacitances between neighboring components. However, these capacitances are not negligible in certain cases, especially at high frequency.

SUMMARY OF THE INVENTION

The present invention aims at providing a structure comprising several electronic components operating at high frequency, insulated with respect to one another, in which the stray capacitances between components are decreased.

To achieve all or part of these objects as well as others, one embodiment of the present invention provides a structure comprising at least two neighboring components, capable of operating at high frequencies, formed in a thin silicon substrate extending on a silicon support of a first conductivity type and separated therefrom by an insulating layer, the components being laterally separated by insulating regions, wherein the silicon support has, at least in the vicinity of its portion in contact with the insulating layer, heavily-doped islands of a second conductivity type, the distance between islands being smaller than twice the extent of the space charge area created by the junction with the silicon support.

According to an embodiment of the present invention, the components are two diodes for protecting a line, the first diode having its anode connected to ground and its cathode connected to the line to be protected and the second diode having its cathode connected to a supply voltage and its anode connected to the line to be protected.

According to an embodiment of the present invention, each diode comprises a silicon well of a first conductivity type having its bottom and its lateral walls bordered by an area of the first conductivity type with a strong doping level and in the surface of which is formed a region of the second conductivity type.

The foregoing and other objects, features, and advantages of the present invention will be discussed in detail in the following non-limiting description of specific embodiments in connection with the accompanying drawings.

BRIEF DESCRIPTION OF THE DRAWINGS

FIG. 4 is an equivalent electric diagram of the structure of FIG. 3;

FIG. 5 illustrates the stray capacitances present in the structure of FIG. 3;

FIG. 6 is an equivalent electric diagram of the structure of FIG. 5; and

FIG. 7 illustrates a structure according to an alternative embodiment of the present invention.

DETAILED DESCRIPTION

Figure 1:
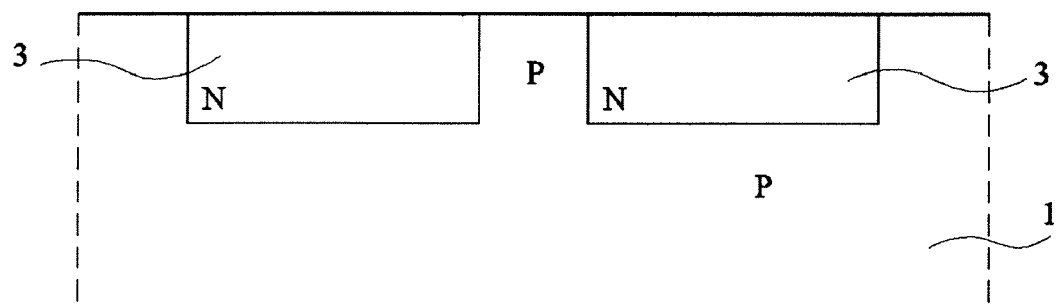
FIGS. 1 and 2, previously described, are cross-section views illustrating two known electronic component forming modes.
Figure 2:
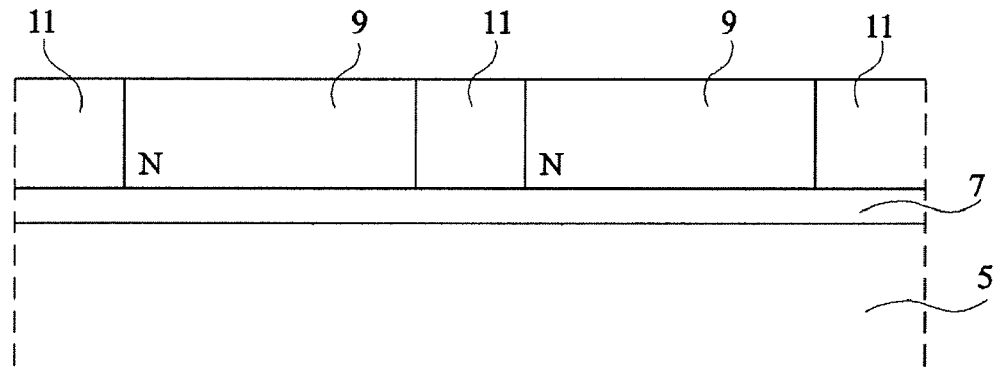

For clarity, the same elements have been designated with the same reference numerals in the different drawings and, further, as usual in the representation of semiconductor components, the various representations of semiconductor components are not drawn to scale.

Figure 3:
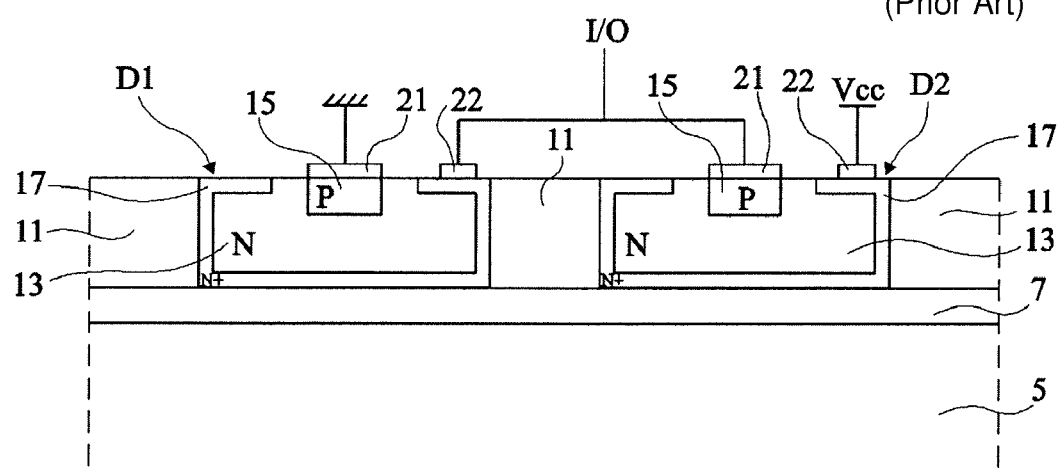
FIG. 3 is a cross-section view of a structure comprising two diodes according to an embodiment of the present invention.

FIG. 3 shows two adjacent diodes D1 and D2 of protection against overvoltages. These diodes are placed side by side and are formed on an SOI-type structure comprising a thin semiconductor substrate formed on an insulating layer 7, itself formed on a semiconductor support 5. Diodes D1 and D2, which are identical, are laterally insulated by insulating regions 11, for example made of silicon oxide. Each diode comprises an N-type doped well 13 in which is formed a P-type doped region 15. The well is surrounded (bottom, lateral walls and part of its upper surface) with a heavily-doped N-type region 17. Anode and cathode contacts 21 and 22 are formed on region 15 and on region 17 in contact with well 13. Anode 21 of diode D1 is grounded. Cathode 22 of diode D2 is connected to a voltage source Vcc. Cathode 22 of diode D1 and anode 21 of diode D2 are connected to a line I/O to be protected.

FIG. 4 shows the equivalent electric diagram of the structure shown in FIG. 3. This circuit comprises diode D1 having its anode connected to ground and its cathode connected to a line I/O to be protected, and diode D2 having its cathode connected to voltage source Vcc and its anode connected to line I/O.

As described previously, components D1 and D2 are insulated from each other by insulating layer 7 and by insulating regions 11. Now, this insulation is not perfect and stray capacitances still exist between the various components, which capacitances must be minimized for a high-frequency operation.

FIG. 5 shows a modeling of the different capacitances of the structure of FIG. 3. The stray capacitance horizontally created between the two wells 13 is called C1. The stray capacitances vertically formed between wells 13 and support 5 are called C2 and C2'. The impedance of support 5 between the areas underlying components D1 and D2 is formed of a resistor Rs in parallel with a capacitor Cs.

FIG. 6 illustrates the way in which the various high-frequency capacitances are associated, in which case it can be considered that terminals Vcc and the ground are connected. This drawing relates to the case where the diodes are off. The diode capacitances are designated as $C_{D1}$ and $C_{D2}$, respectively. Capacitances $C_{D1}$, C1, and $C_{D2}$ are in parallel, the assembly being in parallel with the series assembly of capacitances C2 and C2' and of impedance (Cs/Rs) of support 5.

The applicant has analyzed the circuit operation at 1 MHz. This analysis is summed up by table 1 hereafter. This table indicates the values of the various capacitances for various resistivity values of the material of support 5. The capacitance values are given in arbitrary units, stating that, for a relatively conductive substrate of a resistivity lower than 1 ohm.cm, the assembly of the capacitances of both diodes D1 and D2 and of the associated parasitic elements brings the capacitance on terminal I/O (see FIG. 6) to a value of 1.

TABLE 1

|  | 1 ohm · cm | 10 ohms · cm | 1,000 ohms · cm | 5,000 ohms · cm |
|---|---|---|---|---|
| D1//D2 | 0.64 | 0.64 | 0.64 | 0.64 |
| C1 | 0.08 | 0.08 | 0.08 | 0.08 |
| D1//D2//C1 | 0.72 | 0.72 | 0.72 | 0.72 |
| C2 + C2' | 0.28 | 0.28 | 0.28 | 0.28 |
| Cs | High | High | 0.8 | 0.37 |
| C2 + C2' + Cs | 0.28 | 0.28 | 0.21 | 0.16 |
| Total Cap. | 1 | 1 | 0.93 | 0.88 |

It is considered that diodes D1 and D2 each have a 0.32 capacitance and that capacitance C1 of the oxide walls is 0.08, which brings the parallel value of the capacitances of diodes D1, D2, and C1 to 0.72. Capacitances C2 and C2' corresponding to oxide 7 of the SOI structure have in series a value equal to 0.28. All the above-mentioned capacitances have constant values, independently from the resistance of support 5. However, the equivalent capacitance Cs of the impedance of support 5 depends on the resistivity of this support. Thus, it can be seen that for a frequency of approximately 1 MHz, the contribution of the impedance of support 5 decreases from 0.28 to 0.16 when the resistivity of support 5 increases from 1 to 5,000 ohms.cm. This difference is not very significant and this may be the reason why prior art studies for improving the influence of stray capacitances have come to nothing.

The applicant has carried out the same study in the context of the same circuit operating at a 1 GHz frequency. The results of this study are provided in table 2 hereafter.

TABLE 2

|  | 1 ohm · cm | 10 ohms · cm | 1,000 ohms · cm | 5,000 ohms · cm |
|---|---|---|---|---|
| D1//D2 | 0.64 | 0.64 | 0.64 | 0.64 |
| C1 | 0.08 | 0.08 | 0.08 | 0.08 |
| D1//D2//C1 | 0.72 | 0.72 | 0.72 | 0.72 |
| C2 + C2' | 0.28 | 0.28 | 0.28 | 0.28 |
| Cs | High | 1.6 | 0.01 | 0.01 |
| C2 + C2' + Cs | 0.28 | 0.24 | 0.01 | 0.01 |
| Total Cap. | 1 | 0.96 | 0.73 | 0.73 |

It can be seen that for most of its lines, table 2 corresponds to table 1. Especially, the capacitances of diodes D1 and D2, capacitance C1 and capacitances C2 and C2' practically do not vary along with the frequency. However, equivalent capacitance Cs of the substrate depends a lot on the frequency. While it was relatively high at a 1-MHz frequency, when operating at frequencies close to 1 GHz, its value considerably decreases when the substrate resistivity increases. Thus, as shown by the table, as soon as the substrate resistivity exceeds 1000 ohms.cm, the contribution of capacitances C2, Cs, and C2' altogether becomes negligible: the total capacitance varies from 0.72 in the case where the substrate would have been perfectly insulating to 0.73 as soon as the substrate reaches a resistivity greater than 1,000 ohms.cm, that is, the influence of the substrate becomes negligible. It should however be noted that this could not be observed at frequencies on the order of one megahertz.

Thus, the present invention provides using a substrate of a resistivity equal to or greater than 1000 ohms.cm to reduce the inter-component capacitance of a high-frequency circuit intended to operate a values on the order of one gigahertz or more.

A way to obtain this performance increase without requiring an additional increase in the substrate resistivity is illustrated in FIG. 7. Heavily-doped islands 23 of the conductivity type opposite to that of the substrate, for example, N⁺ islands in a P substrate, are formed in the upper substrate portion. This results in the creation of a depleted area 25 free of any carrier, which can be considered as equivalent to an insulator. In the case of a substrate of a doping level on the order of $5.10^{12}$ atoms/cm³, the extent of the depleted area is on the order of from 10 to 15 μm. A structure having a heavily-insulating upper portion is thus obtained, which enables improving the performances displayed in table 1, achieving the advantages previously discussed in relation with table 2.

With the above-indicated method, it should be noted that the frequency for which a decrease in the stray capacitance is obtained is decreased. Thus, low stray capacitance values may be provided, such as indicated in the right-hand column of table 2, at frequencies much lower than 1 GHz. The present invention can then usefully be applied to devices operating, for example, at frequencies on the order of one megahertz.

The present invention has been described in the context of the association of two protection diodes for high-frequency circuits. It should be understood that the present invention may find other applications and generally applies in the high-frequency field when the stray capacitances between two components are desired to be as negligible as possible.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A structure comprising at least two neighboring components formed in a thin silicon substrate extending on a silicon support of a first conductivity type and separated from the silicon support by an insulating layer, the components being laterally separated by insulating regions, wherein the silicon support has, at least in the vicinity of a portion in contact with the insulating layer, heavily-doped islands of a second conductivity type, the distance between islands being smaller than twice an extent of a space charge area determined by doping levels of the islands and of the silicon support.

2. The structure of claim 1, wherein the at least two neighboring components comprise a first diode and a second diode for protecting a line, the first diode having its anode connected to ground and its cathode connected to the line to be protected and the second diode having a cathode connected to a supply voltage and its anode connected to the line to be protected.

3. The structure of claim 2, wherein each diode comprises a silicon well of a first conductivity type, the silicon well having a bottom and lateral walls bordered by an area of the first conductivity type with a strong doping level and in the surface of which is formed a region of the second conductivity type.

4. The structure of claim 1, wherein the structure is arranged such that, when the structure receives as input a signal at a frequency exceeding one gigahertz, at least one capacitance between the at least two neighboring components does not disrupt the signal.

5. The structure of claim 1, wherein the distance between the heavily-doped islands is such that, when the structure is operated and respective depletion region is formed by each of the heavily-doped islands, the respective depletion regions overlap to form a single depletion region.

6. An apparatus comprising:
a semiconductor substrate of a first conductivity type;
an insulating layer formed on the semiconductor substrate;
heavily-doped islands of a second conductivity type spaced along an interface between the semiconductor substrate and the insulating layer and separated by a distance less than twice an extent of a space charge region extending from each island, the space charge region determined by doping levels of the islands and of the semiconductor substrate; and
a semiconductor device formed on the insulating layer,
wherein the semiconductor substrate is configured to have a resistivity of greater than or equal to one kilohm-cm during an operation of the apparatus.

7. The apparatus of claim 6, wherein the extent of the space charge region extending from each heavily-doped island is between about 10 microns and about 15 microns.

8. The apparatus of claim 6, wherein the semiconductor device comprises a p-n diode.

9. The apparatus of claim 6, wherein the semiconductor substrate comprises p-type material.

10. The apparatus of claim 6, wherein the apparatus is capable of being operated at frequencies exceeding one gigahertz with negligible contribution of capacitance from the semiconductor substrate.

11. The apparatus of claim 6,
wherein the heavily-doped islands form in the semiconductor substrate a continuous depletion region stretching across the semiconductor substrate and under the semiconductor device.

12. The apparatus of claim 11, wherein the second conductivity type comprises a different carrier type from the first conductivity type.

13. The apparatus of claim 11, wherein the semiconductor device comprises a first diode connected to a second diode.

14. The apparatus of claim 13, wherein a first terminal of the first diode is connected to a first potential, a second terminal of the first diode is connected to a first terminal of the second diode, and a second terminal of the second diode is connected to a second potential.

15. The apparatus of claim 13, wherein each diode comprises a silicon well of a first conductivity type, the silicon well having a bottom and lateral walls bordered by an area of the first conductivity type with a heavy doping level.

16. The apparatus of claim 6, wherein a dimension of each heavily doped island in the plane of the substrate is smaller than a dimension of the semiconductor device in the plane of the substrate.

17. A semiconductor structure comprising:
a thin semiconductor layer;
an insulating layer;
a semiconductor substrate of a first conductivity type; and
heavily-doped islands of a second conductivity type spaced along an interface between the semiconductor substrate and the insulating layer and separated by a distance less than twice an extent of a space charge region extending from each island, the space charge region determined by doping levels of the islands and of the semiconductor substrate.

18. The semiconductor structure of claim 17, further comprising at least one semiconductor device formed in the thin semiconductor layer.

19. The semiconductor structure of claim 18, wherein the at least one semiconductor device comprises a diode.

20. The semiconductor structure of claim 17, wherein the semiconductor substrate has a resistivity greater than or equal to one kilohm-cm in the vicinity of the insulating layer.

* * * * *